United States Patent
Inami

(10) Patent No.: US 10,553,395 B2
(45) Date of Patent: Feb. 4, 2020

(54) ION BEAM IRRADIATION DEVICE AND ION BEAM IRRADIATION METHOD

(71) Applicant: NISSIN ELECTRIC CO., LTD., Kyoto (JP)

(72) Inventor: Hiroshi Inami, Kyoto (JP)

(73) Assignee: NISSIN ELECTRIC CO., LTD., Kyoto (JP)

(*) Notice: Subject to any disclaimer, the term of this patent is extended or adjusted under 35 U.S.C. 154(b) by 0 days.

(21) Appl. No.: 16/096,301

(22) PCT Filed: Apr. 21, 2017

(86) PCT No.: PCT/JP2017/015983
§ 371 (c)(1),
(2) Date: Oct. 25, 2018

(87) PCT Pub. No.: WO2017/188132
PCT Pub. Date: Nov. 2, 2017

(65) Prior Publication Data
US 2019/0139741 A1    May 9, 2019

(30) Foreign Application Priority Data
Apr. 25, 2016 (JP) .................. 2016-087227

(51) Int. Cl.
*H01J 37/317* (2006.01)
*H01L 21/265* (2006.01)
(Continued)

(52) U.S. Cl.
CPC ........ *H01J 37/3171* (2013.01); *C23C 14/505* (2013.01); *H01J 37/08* (2013.01);
(Continued)

(58) Field of Classification Search
CPC .. H01J 37/317; H01J 37/3171; H01J 37/3172; H01J 37/32412; H01J 37/36
(Continued)

(56) References Cited

U.S. PATENT DOCUMENTS

| 7,176,470 B1* | 2/2007 | Evans ................. H01J 37/304 250/398 |
| 2009/0078890 A1* | 3/2009 | Yamashita ............. H01J 27/14 250/492.3 |

FOREIGN PATENT DOCUMENTS

| JP | 2010086824 | 4/2010 |
| JP | 2010539674 | 12/2010 |

OTHER PUBLICATIONS

"International Search Report (Form PCT/ISA/210) of PCT/JP2017/015983," dated Jul. 11, 2017, with English translation thereof, pp. 1-2.

* cited by examiner

Primary Examiner — Jason L McCormack
(74) Attorney, Agent, or Firm — JCIPRNET

(57) ABSTRACT

An ion beam irradiation device is provided and including: a substrate holder that holds a substrate; a rotating mechanism that rotates the substrate holder about a center portion of the substrate being held; a reciprocating mechanism that reciprocates the substrate holder and the rotating mechanism in the moving direction; an ion beam irradiator that irradiates the substrate with an ion beam; and a control device that controls the rotating mechanism and the reciprocating mechanism. The ion beam has a center region where the beam current density is a predetermined value or more in the moving direction, and a peripheral region where the beam current density is less than the predetermined value, a center (Continued)

region size in the direction orthogonal to the moving direction is larger than a substrate size in the direction orthogonal to the moving direction.

12 Claims, 7 Drawing Sheets

(51) Int. Cl.
    *H01J 37/30*     (2006.01)
    *C23C 14/50*     (2006.01)
    *H01J 37/08*     (2006.01)
    *H01J 37/32*     (2006.01)

(52) U.S. Cl.
    CPC ............ *H01J 37/30* (2013.01); *H01J 37/317* (2013.01); *H01J 37/32715* (2013.01); *H01L 21/265* (2013.01); *H01J 2237/20207* (2013.01); *H01J 2237/20214* (2013.01)

(58) Field of Classification Search
    USPC ................... 250/492.1, 492.2, 492.21, 492.3
    See application file for complete search history.

ION BEAM IRRADIATION DEVICE AND ION BEAM IRRADIATION METHOD

CROSS-REFERENCE TO RELATED APPLICATION

This application is a 371 application of the international PCT application serial no. PCT/JP2017/015983, filed on Apr. 21, 2017, which claims the priority benefits of Japan application no. 2016-087227, filed on Apr. 25, 2016. The entirety of each of the abovementioned patent applications is hereby incorporated by reference herein and made a part of this specification.

TECHNICAL FIELD

The present invention relates to an ion beam irradiation device and an ion beam irradiation method for performing processing on a substrate by irradiating the substrate with an ion beam in a vacuum atmosphere, such as an ion milling device or an ion injection device, for example.

BACKGROUND ART

As this type of ion beam irradiation device, there is one provided with an ion source that extracts an ion beam that has a rectangular sectional surface with a long side size that is longer than a substrate and a short side size that is shorter than the substrate, a reciprocating mechanism that reciprocates the substrate in a short side direction of the ion beam such that the substrate travels across an ion beam irradiation region, and a rotating mechanism that causes the substrate to rotate in a stepwise manner about a central portion when the substrate is outside the ion beam irradiation region, as disclosed in Patent Document 1.

However, since the substrate is caused to move to the outside of the ion beam irradiation region every time the substrate is reciprocated, a substrate processing efficiency deteriorates, and it takes a long time to perform the substrate processing.

In addition, since the substrate is caused to rotate outside the ion beam irradiation region, it is necessary to cause the substrate to move to the outside of the ion beam irradiation region every time the substrate is caused to rotate, this leads to an increase in the number of times the substrate is reciprocated, and this also leads to an increase in time required to perform the substrate processing.

Further, if the substrate is caused to move (scan) to the outside of the irradiation region again from the outside of the ion beam irradiation region across the irradiation region, an effective beam current density in the irradiation of the substrate decreases.

Specifically, the effective beam current density ie per scanning becomes ie=I/(L×D), as illustrated in FIG. 7. Here, I is a beam current with a length, which corresponds to a substrate diameter length, in the ion beam, L is a substrate scanning length (the amount of movement of the substrate), D is a substrate diameter, and BW is a width of the ion beam. Also, since the substrate travels across the ion beam irradiation region, L>BW+D is satisfied. In a case in which L does not meet this condition, it is difficult to obtain uniformity in the substrate processing. As is clear from the aforementioned equation, the effective beam current density ie decreases as the scanning length L increases. Also, since a substrate processing time is proportional to the effective beam current density ie, a long scanning length L is disadvantageous.

CITATION LIST

Patent Literature

[Patent Literature 1]: Japanese Unexamined Patent Application Publication (Translation of PCT Application) No. 2010-539674

SUMMARY OF INVENTION

Technical Problem

The present invention has been realized in view of the aforementioned circumstances, and an objective thereof is to solve the problems in the related art and shorten the time require for processing a substrate.

Solution to Problem

That is, an ion beam irradiation device according to the present invention includes: a vacuum container that is exhausted to a vacuum; a substrate holder that holds a substrate in the vacuum container; a rotating mechanism that causes the substrate holder to rotate about a center portion of the substrate being held by the substrate holder; a reciprocating mechanism that reciprocates the substrate holder and the rotating mechanism in a predetermined moving direction; an ion beam irradiator that irradiates the substrate being held by the substrate holder with an ion beam; and a control device that controls the rotating mechanism and the reciprocating mechanism, the ion beam has a center region where a beam current density is a predetermined value or more in the moving direction, and a peripheral region which is formed on both sides of the center region and where the beam current density is less than the predetermined value, a center region size in a direction orthogonal to the moving direction is larger than a substrate size in the direction orthogonal to the moving direction, and the control device reciprocates the substrate being held by the substrate holder such that a part of the substrate overlaps a beam irradiation range even at both reciprocating ends and continuously rotates the substrate while the substrate is being reciprocated.

According to such an ion beam irradiation device, it is possible to further shorten the time required to perform substrate processing as compared with a case in which the substrate is caused to move to the outside of the ion beam irradiation region since the substrate being held by the substrate holder is reciprocated such that a part of the substrate overlaps the beam irradiation range even at both reciprocating ends.

Here, it is possible to reduce the distance of movement of the substrate by reciprocating the substrate being held by the substrate holder such that a part of the substrate overlaps the beam irradiation range even at both reciprocating ends, and as a result, it is possible to increase the effective beam current density of the substrate, and this also enables reduction in time required to perform the substrate processing.

In the present invention, a case in which the center region size of the ion beam in the moving direction is larger than the substrate size in the moving direction in a case in which a substrate inclination angle is 0 degrees may also be conceived. However, if the diameter of the substrate, such as a recent silicon wafer, is 300 mm, the size of an ion source increases, heat deformation of an extraction electrode system, for example, of the ion source increases, and it thus becomes difficult to control the beam with this configuration. In addition, it is difficult to produce the ion source at low cost.

In order to suitably solve the problem, it is desirable that the center region size in the moving direction be smaller than the substrate size in the moving direction.

Although the amount of movement of the substrate may be set to be large enough that a part of the substrate overlaps the beam irradiation range at both the reciprocating ends, a large amount of movement leads to a decrease in the effective beam current density of the substrate, and there is a concern that a device processing ability (producibility) will deteriorate.

Therefore, when the moving direction is defined as the left to right direction, it is desirable that the distance between the ends of the substrate between the right end of the substrate when the substrate moves to the leftmost side and the left end of the substrate when the substrate moves to the rightmost side be equal to or less than (not including zero) the center region size in the moving direction.

Here, if the substance end distance is shorter than the ion beam center region size in the moving direction, a part of the substrate is always included in the center region with a high beam current density, and it is difficult to uniformly irradiate the substrate with the ion beam. Although it is possible to darken a part (light part) irradiated with the ion beam in the peripheral region by irradiating the center region with the ion beam for correction, it is not possible to lighten a part (dark part) irradiated with the ion beam in the center region by correction, and it is thus difficult to control uniformity of the irradiation amount of the ion beam.

In order to suitably solve this problem, it is desirable that the substrate end distance be equal to the center region size in the moving direction.

In a case in which the irradiation shape of the center region is a rectangular shape, it is possible to irradiate the substrate with the ion beam as long as the longitudinal direction of the center region intersects the moving direction of the substrate.

However, in a case in which the longitudinal direction of the center region intersects the moving direction of the substrate at an angle other than a right angle, the amount of movement of the substrate becomes large, and also, it becomes necessary to increase the length of the ion beam.

Therefore, it is desirable that the irradiation shape of the center region be a rectangular shape and that the longitudinal direction thereof orthogonally intersect the moving direction.

It is desirable that the control device control the reciprocating mechanism on the basis of control waveforms in which the position of the substrate is a continuous function of time. Here, substantially triangular waves obtained by blunting apexes of triangular waves and sine waves may be conceived for the control waveforms.

With this configuration, it is possible to more effectively average the beam current density distribution on the substrate.

In addition, an ion beam irradiation method according to the present invention is an ion beam irradiation method performed on a substrate in a vacuum atmosphere, the method including: using an ion beam irradiation device that includes a vacuum container that is exhausted to a vacuum; a substrate holder that holds a substrate in the vacuum container; a rotating mechanism that causes the substrate holder to rotate about a center portion of the substrate being held by the substrate holder; reciprocating mechanism that reciprocates the substrate holder and the rotating mechanism in a predetermined moving direction; and an ion beam irradiator that irradiates the substrate being held by the substrate holder with an ion beam; the ion beam having a center region where a beam current density is a predetermined value or more in the moving direction, and a peripheral region which is formed on both sides of the center region and where the beam current density is less than the predetermined value, a center region size in a direction orthogonal to the moving direction being larger than a substrate size in the direction orthogonal to the moving direction, and reciprocating the substrate being held by the substrate holder such that a part of the substrate overlaps a beam irradiation range even at both reciprocating ends, and continuously rotating the substrate while the substrate is being reciprocated, thereby irradiating the substrate with the ion beam.

Advantageous Effects of Invention

According to the present invention configured as described above, it is possible to reduce the time required to perform substrate processing since the substrate is reciprocated such that a part of the substrate overlaps the beam irradiation range even at both reciprocating ends and the substrate is caused to continuously rotate while being reciprocated.

DESCRIPTION OF EMBODIMENTS

Hereinafter, an embodiment of an ion beam irradiation device according to the present invention will be described with reference to drawings. Note that an X direction, a Y direction, and a Z direction that orthogonally intersect each other at one point are illustrated in the respective drawings for easy understanding of the directions. For example, the X direction and the Z direction are horizontal directions, and the Y direction is a vertical direction. An ion beam advances in the Z direction in this example.

<Device Configuration>

Figure 1:
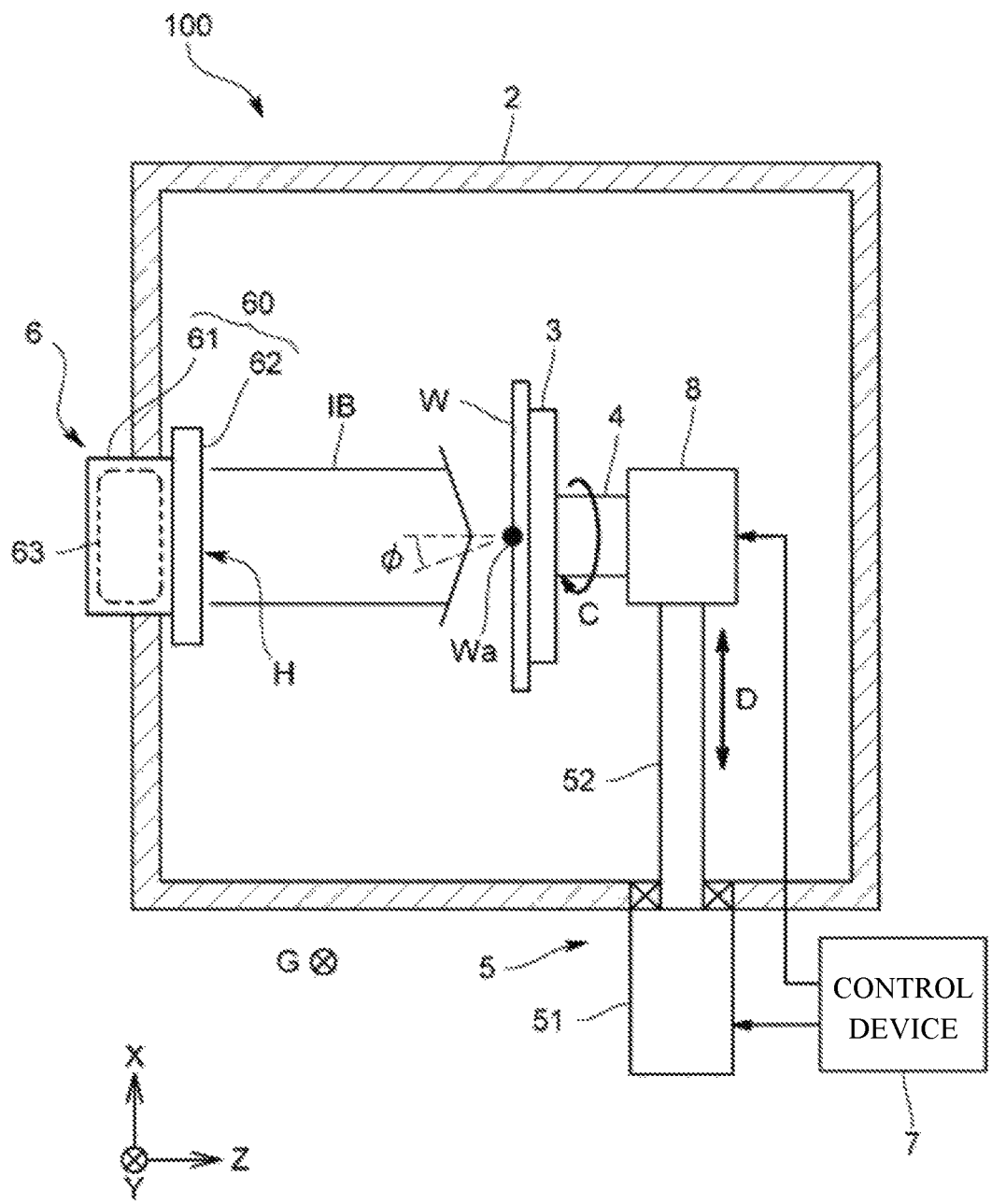
FIG. 1 is a sectional view schematically illustrating a configuration of an ion beam irradiation device according to the embodiment.

An ion beam irradiation device 100 according to the embodiment is a device that processes a substrate W by irradiating the substrate W with an ion beam IB in a vacuum atmosphere as illustrated in FIG. 1. Although the substrate W is a semiconductor substrate such as a silicon wafer or a substrate in which a film such as a magnetic film is formed on a surface of a semiconductor substrate, for example, the substrate is not limited thereto. Also, although the shape of the substrate W is a circular shape (a shape that has an orientation flat or a notch on a part of a circumference is also included), for example, the shape of the substrate W is not limited thereto.

Specifically, the ion beam irradiation device 100 includes a vacuum container 2 which is exhausted to vacuum by a vacuum exhausting device, which is not illustrated in the drawings, a substrate holder 3 that holds the substrate W in the vacuum container 2, a rotating mechanism 4 that causes the substrate holder 3 to rotate, a reciprocating mechanism 5 that reciprocates the substrate holder 3 and the rotating mechanism 4, an ion beam irradiator 6 that irradiates the substrate W with the ion beam IB, and a control device 7 that controls the rotating mechanism 4 and the reciprocating mechanism 5.

The substrate holder 3 includes an electrostatic chuck, for example, and is provided such that the substrate holder 3 can be rotated by the rotating mechanism 4 and can be reciprocated by the reciprocating mechanism 5 in the vacuum container 2. In addition, the substrate holder 3 according to the embodiment is provided such that the substrate holder 3 can be inclined by a tilting mechanism 8 that changes a tilt angle (inclination angle) $\phi$ of the substrate W relative to the ion beam IB.

The rotating mechanism 4 is adapted to cause the substrate W being held by the substrate holder 3 to rotate about a central portion Wa thereof by causing the substrate holder 3 to rotate. The rotating mechanism 4 is adapted to cause the substrate W to continuously rotate in a clockwise direction or a counterclockwise direction about the central portion Wa. Although an example of a rotation direction C is illustrated in FIG. 1, the rotation direction may be a direction opposite thereto.

The reciprocating mechanism 5 is adapted to reciprocate the substrate W being held by the substrate holder 3 in a moving direction D by mechanically reciprocating the substrate holder 3, the rotating mechanism 4, and the tilting mechanism 8 in the predetermined moving direction D (the X direction in FIG. 1 and the like). The outward trip and the return trip of the substrate W caused by the reciprocating mechanism 5 are linear movements, and also, the outward trip and the return trip are configured to overlap one another. Note that the reciprocating mechanism 5 includes an actuator 51 that is provided outside the vacuum container 2 and a drive shaft 52 that is coupled to the substrate holder 3, the rotating mechanism 4, and the like and is driven by the actuator 51. Although the actuator 51 is provided outside the vacuum container 2 in this example, it is not limited thereto.

The ion beam irradiator 6 is adapted to irradiate the substrate W being held by the substrate holder 3 with the ion beam IB. The ion beam irradiator 6 is adapted to irradiate the substrate W with the ion beam IB with a rectangular sectional surface and is formed by using an ion source 60. The ion source 60 has a plasma generation portion 61 that generates a plasma 63 and an extraction electrode system 62 that extracts the ion beam IB by an effect of an electric field from the plasma 63. The ion source 60 may be arranged inside the vacuum container 2 along with the extraction electrode system 62 or may be arranged outside the vacuum container 2.

In the embodiment, the extraction direction of the ion beam IB from the ion source 60 is preferably a direction that intersects a direction of gravity G (a substantially orthogonally intersecting direction as in the example illustrated in FIG. 1 or an oblique direction, for example). Specifically, a beam extraction port H of the ion source 60 and the substrate W face one another in the horizontal direction. In this manner, it is not necessary to arrange the substrate W immediately below the ion source 60, and foreign matter (dirt) such as pieces detached from deposits inside the ion source 60 tend not to be mixed into the substrate W even if foreign matter drops from the ion source 60. As a result, it is possible to prevent occurrence of defects in the processing of the substrate W due to mixing in of the foreign matter.

Note that the ion source 60 may be (a) a so-called bucket-type ion source (also referred to as a multi-pole magnetic field-type ion source) that uses a multi-pole magnetic field (cusp magnetic field) to perform enclosure or the like of the plasma 63, (b) a high-frequency ion source that generates the plasma 63 by high-frequency electric discharge, or (c) a so-called Bernas-type ion source that causes a negative pole to face a reflective electrode and applies a magnetic field in a direction along an axis connecting both the negative pole and the reflective electrodes, thereby generating the plasma 63. In addition, the number of electrodes that are included in the extraction electrode system 62 is not limited to a particular number. Also, cooling pipes may or may not be provided at the electrodes that are included in the extraction electrode system 62 as needed.

Figure 2:
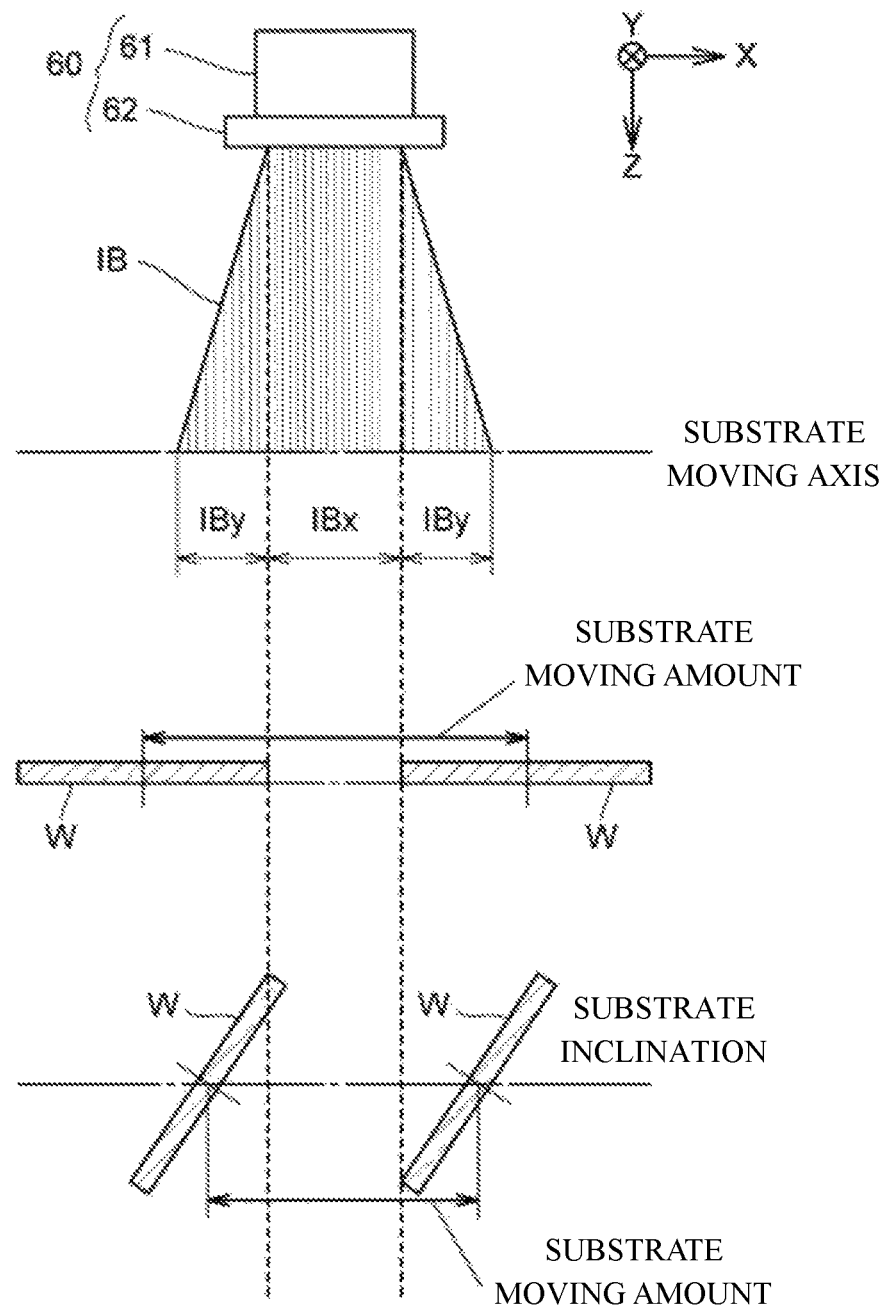
FIG. 2 is a schematic diagram illustrating a relationship between an ion beam and the amount of movement of a substrate in a ZX plane according to the embodiment.
Figure 3:
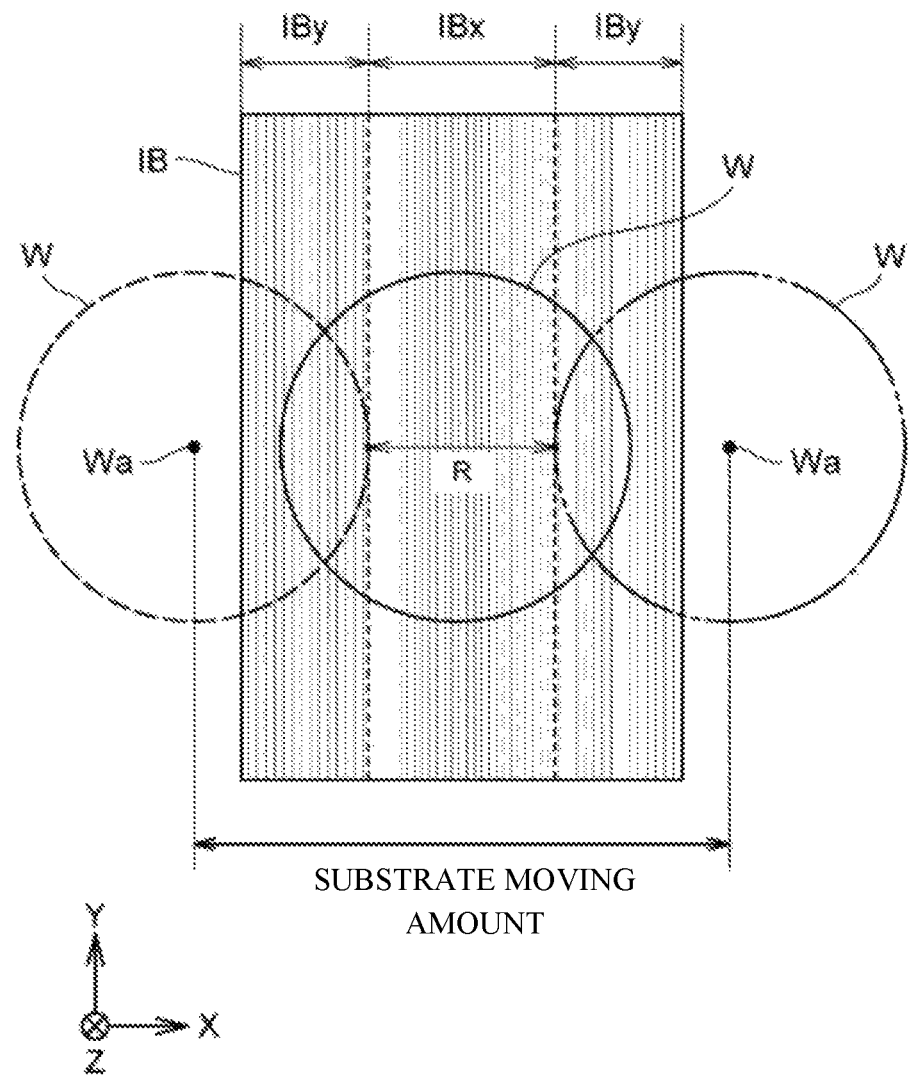
FIG. 3 is a schematic diagram illustrating a relationship between the ion beam and the amount of movement of the substrate in an XY plane according to the embodiment.

The substrate W is irradiated with the ion beam IB with which the substrate W is irradiated by the ion source 60 such that the longitudinal direction of the ion beam IB orthogonally intersects the moving direction D as illustrated in FIG. 2 and FIG. 3. In addition, the ion beam IB has, in the irradiation region thereof, a center region IBx, in which a beam current density is equal to or greater than a predetermined value in the moving direction D (X direction) and a peripheral region IBy, which is formed on both sides of the center region IBx, in which the beam current density is less than the predetermined value. The ion beam IB with a rectangular sectional surface is formed by being emitted from a beam extraction port H (a beam extraction region of the extraction electrode system 62), which has a rectangular shape, of the ion source 60.

The aforementioned predetermined value may be set to a beam current density of a predetermined proportion such as 50%, for example, of a peak value of the beam current density. In addition, the aforementioned predetermined value may be set such that a part expanding outwards in the X direction from both ends of the beam extraction port H of the ion source 60 in the X direction or an outer edge part of the irradiation region corresponds to the peripheral region IBy.

The center region IBx is a region in which the beam current density distribution of the ion beam IB is substantially uniform or regularly changes. The center region IBx has a rectangular irradiation shape, and the size in the longitudinal direction (Y direction) that orthogonally intersects the moving direction D is greater than the size of the substrate W in the Y direction while the size in the moving direction D (X direction) is smaller than the size of the substrate W in the X direction at the substrate inclination angle of 0 degrees.

In addition, each peripheral region IBy is a region, which is a foot part of the beam current density distribution of the ion beam IB, in which the beam current density distribution is not uniform. Each peripheral region IBy has a rectangular irradiation shape similarly to the center region IBx, and the size in the Y direction is greater than the size of the substrate W in the Y direction while the size in the X direction is smaller than the size of the substrate W in the X direction at the substrate inclination angle of 0 degrees. Although the size of each peripheral region IBy in the X direction is assumed to be smaller than the size of the center region IBx in the X direction in the embodiment, the size is not limited thereto.

In addition, the control device 7 controls the rotating mechanism 4 and the reciprocating mechanism 5, thereby reciprocating the substrate W being held by the substrate holder 3 such that a part of the substrate W overlaps the beam irradiation range even at both reciprocating ends and causing the substrate W to continuously rotate during the reciprocation. Note that the control device 7 also has a function of controlling the tilting mechanism 8 to control the tilt angle φ of the substrate W.

Specifically, the control device 7 reciprocates the substrate W such that a substrate end distance R between a right end of the substrate W when the substrate W moves to the leftmost side and a left end of the substrate W when the substrate W moves to the rightmost side is equal to or less than the dimension of the center region IBx in the X direction in a case in which the moving direction D (X direction) is a left-right direction, as illustrated in FIG. 3. In the embodiment, the control device 7 reciprocates the substrate W such that the substrate end distance R is equal to the size of the center region IBx in the X direction. Note that the substrate W represented by the broken line in FIG. 3 illustrates an exemplary case in which the substrate W is positioned on the leftmost side during the reciprocation while the substrate W represented by the double-dotted-dashed line illustrates a case in which the substrate W is positioned on the rightmost side during the reciprocation.

Figure 4:
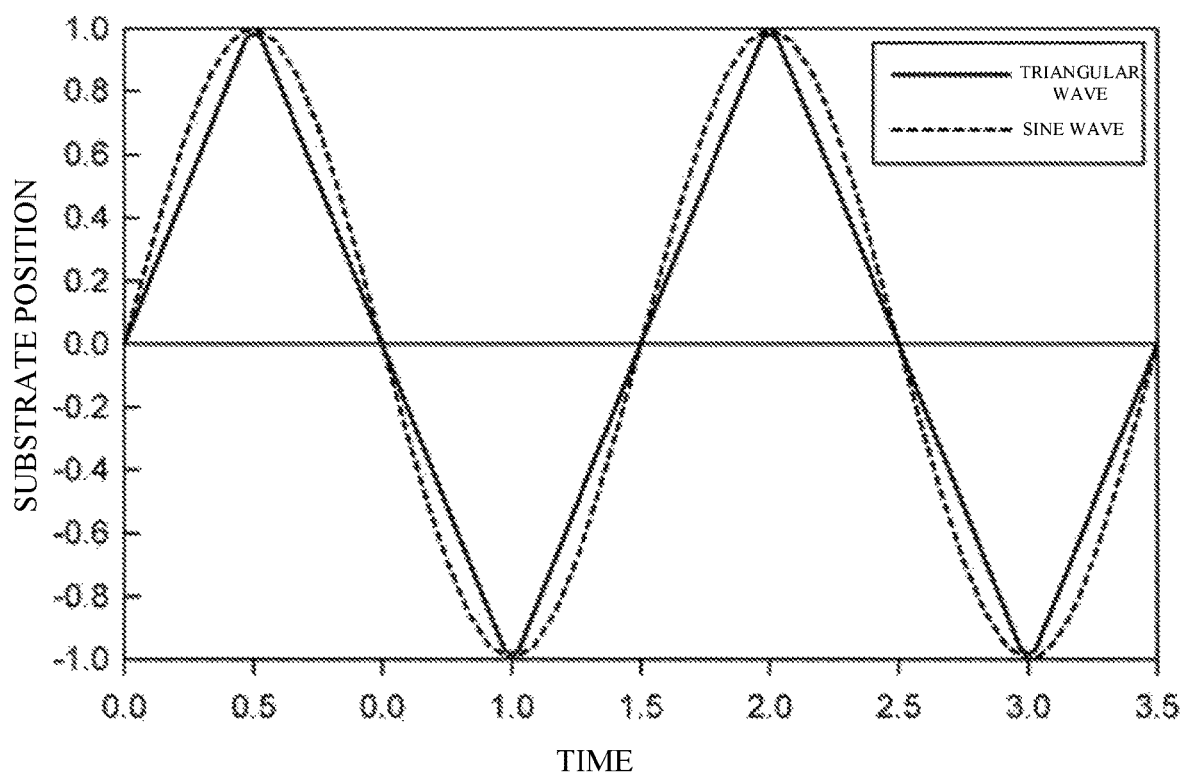
FIG. 4 is a diagram illustrating an example of control waveforms according to the embodiment.

In the reciprocation, the control device 7 controls the reciprocating mechanism 5 on the basis of control waveforms in which the position of the substrate W is a continuous function of time. For example, substantially triangular waves obtained by blunting apexes of triangular waves and sine waves may be employed, as illustrated in FIG. 4. Using substantially triangular waves as the control waveforms facilitates control since it is only necessary to cause a most part of the reciprocation of the substrate W to move at a constant speed.

In addition, the control device 7 is adapted to cause the substrate W to rotate once or continuously rotate a plurality of times in an outward trip of the reciprocation, that is, in the process in which the substrate W travels across the center region IBx from the right to the left, and is adapted to cause the substrate W to rotate once or continuously rotate a plurality of times in the return trip, that is, in the process in which the substrate W travels across the center region IBx from the left to the right. Here, although the speed at, which the substrate W is caused to rotate by the rotating mechanism 4 during the reciprocation is constant, the speed may be variable depending on processing details or the like. Note that the rotation frequency of the substrate W in the outward trip and the rotation frequency of the substrate W in the return trip may be the same as or different from each other.

Although the size of the ion beam IB in the short side direction (X direction) is greater than the size of the substrate W in the X direction in the above description, the size of the ion beam IB in the X direction may be smaller than the size of the substrate W in the X direction.

Figure 5:
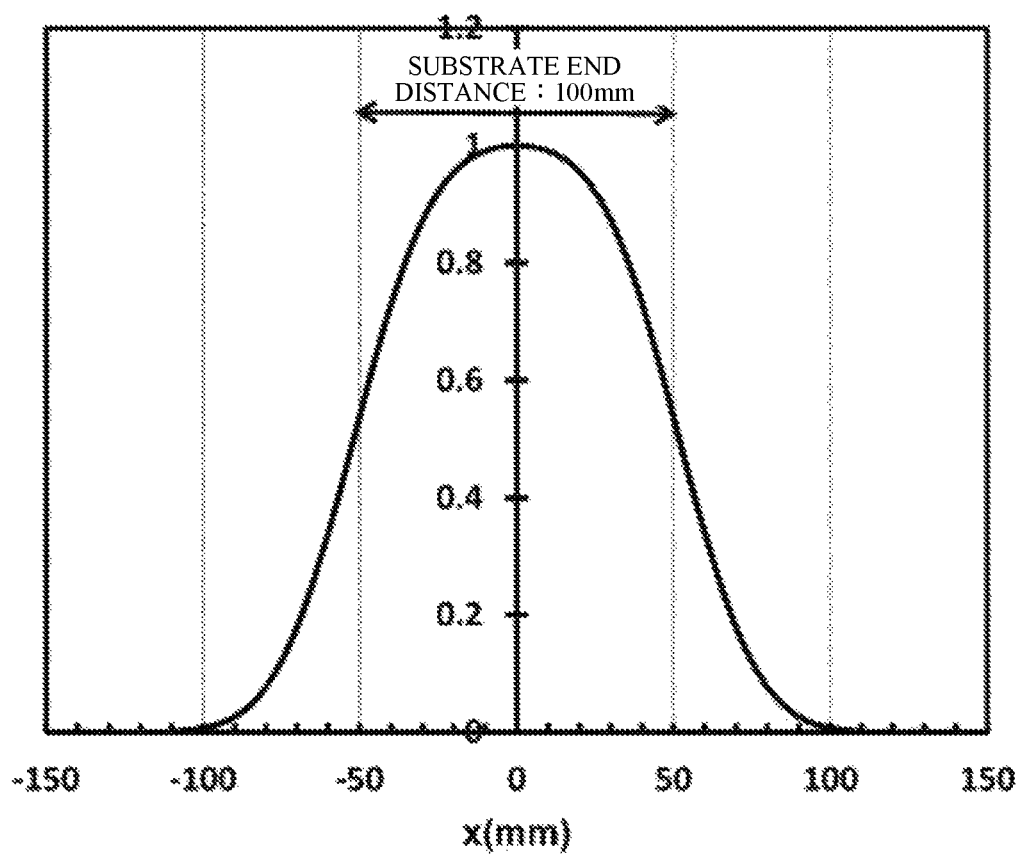
FIG. 5 is a distribution model of a standardized current density in a short side direction of the ion beam.
Figure 6:
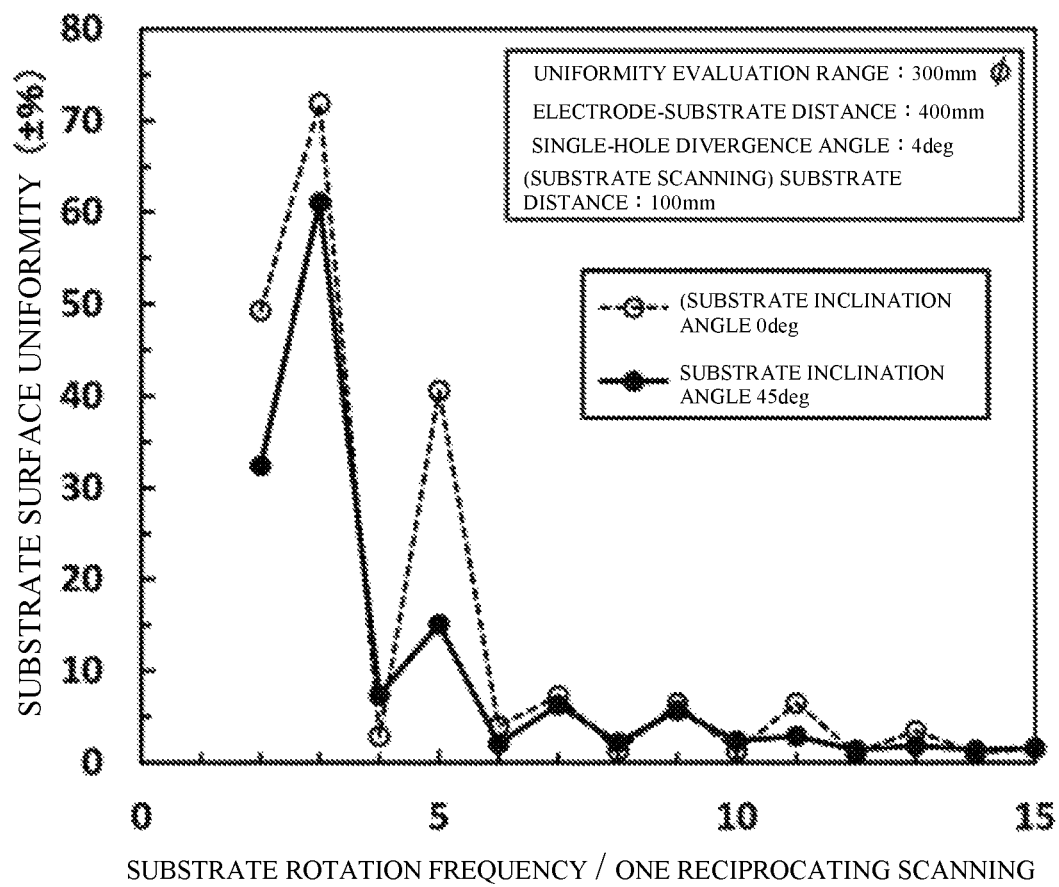
FIG. 6 is a simulation result illustrating a relationship between uniformity in a milling rate of a substrate surface and a substrate rotation frequency.
Figure 7:
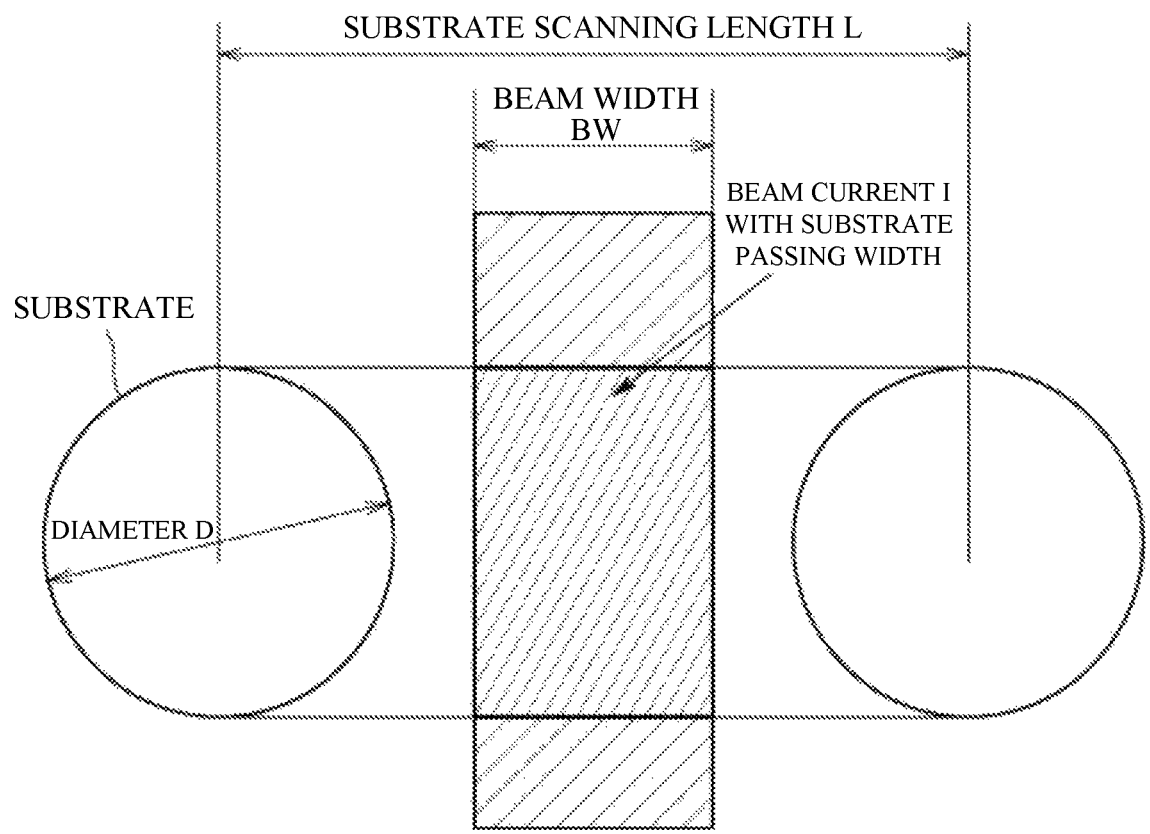
FIG. 7 is a schematic diagram for describing a conventional effective beam current density per scanning.

Next, a relationship between uniformity in a milling rate of the substrate surface when the ion beam IB illustrated in FIG. 5 is used and the rotation frequency of the substrate is illustrated in FIG. 6. FIG. 5 illustrates a distribution model of a standardized current density in the short side direction of the ion beam IB. As for the ion beam IB, the amount of movement of the substrate W is set such that the substrate end distance R is 100 mm. Note that the distance between the extraction electrode system 62 of the ion source 60 and the substrate W is 400 mm.

As illustrated in the simulation result in FIG. 6, it is found that the uniformity in the milling rate of the substrate surface is further improved as the rotation frequency in one reciprocation increases. Also, it is found that the uniformity in the milling rate is further improved in a case in which the rotation frequency in one reciprocation is an even number, that is, in a case in which the rotation frequency in the outward trip movement and the rotation frequency in the return trip movement are the same. Further, it is found from FIG. 6 that the uniformity in the milling rate when the substrate W rotates is further improved in a case in which the inclination angle (tilt angle φ) of the substrate W is 45 degrees than in the case in which the inclination angle is 0 degrees.

Effects of the Embodiment

According to the ion beam irradiation device 100 of the embodiment configured as described above, it is possible to perform processing on the substrate W by irradiating the entire surface of the substrate W with the ion beam IB. For example, it is possible to perform ion milling working, such as scraping the surface thereof, on the substrate W. In addition, it is also possible to perform ion injection on the substrate W. The type of the ion beam IB may be selected in accordance with content of processing to be performed on the substrate W. In a case in which ion milling is performed, for example, an inert gas ion beam or the like, such as an argon ion beam, for example, may be used as the ion beam IB. In a case in which ion injection is performed, an ion beam containing a desired dopant may be used as the ion beam IB.

According to the ion beam irradiation device 100 of the embodiment, in particular, it is possible to shorten the time required to perform processing on the substrate W and to improve processing efficiency for the substrate W as compared with a case in which the substrate is caused to move to the outside of the irradiation region of the ion beam IB and stepped rotation is performed, since the substrate W is reciprocated such that a part of the substrate W overlaps the beam irradiation range even at both reciprocating ends.

Here, it is possible to shorten the moving distance of the substrate W by reciprocating the substrate W such that a part of the substrate W overlaps the beam irradiation range even at both reciprocating ends. As a result, it is possible to increase the effective beam current density of the substrate W, and this also enables reduction of the time required to perform processing on the substrate W.

Next, an embodiment of an ion beam irradiation method according to the present invention will be described. A method of irradiating the entire surface of the substrate W with the ion beam IB by using the ion beam irradiation device 100 as described above may be used (however, it is not necessary to use the aforementioned control device 7 in a case of this method and thus to include the control device 7) to rotate and reciprocate the substrate W as described above within the irradiation range of the ion beam IB.

In the case of the ion beam irradiation method, it is also possible to shorten the time required to perform processing on the substrate W and to improve processing efficiency for the substrate W as compared with a case in which the substrate is moved to the outside of the beam and is caused to rotate in a stepwise manner as in the conventional example, in relation to both the reciprocation and the rotation of the substrate W, in the same manner as in the case of the aforementioned ion beam irradiation device 100 since the irradiation with the ion beam IB is performed while the substrate W being held by the substrate holder 3 is reciprocated such that a part of the substrate W overlaps the beam irradiation range even at both reciprocating ends and the substrate W is caused to continuously rotate during the reciprocation.

Other Embodiments

Note that the present invention is not limited to the aforementioned embodiment. For example, the configuration of the ion beam irradiator 6 may include the ion source 60 and an ion optical element with a configuration in which the ion beam IB extracted from the ion source 60 is enlarged with an electric field and/or a magnetic field and is further averaged as needed.

The reciprocation performed by the reciprocating mechanism 5 on the substrate W or the like may be reciprocation other than linear reciprocation. For reciprocation other than linear reciprocation, the substrate W or the like may be reciprocated in a scheme in which the holder that holds the substrate W is supported at one end of an arm, a reversible rotation drive source is coupled to the other end of the arm (also referred to as a swing arm), and the arm is caused to pivot (swing) in a reciprocating manner within a predetermined angular range.

In addition, it is needless to say that the present invention is not limited to the aforementioned embodiments, and that various modifications can be made without departing from the gist thereof.

The invention claimed is:

1. An ion beam irradiation device, comprising:
a vacuum container that is exhausted to vacuum;
a substrate holder that holds a substrate in the vacuum container;
a rotating mechanism that causes the substrate holder to rotate about a center portion of the substrate being held by the substrate holder;
a reciprocating mechanism that reciprocates the substrate holder and the rotating mechanism in a moving direction which is predetermined;
an ion beam irradiator that irradiates the substrate being held by the substrate holder with an ion beam; and
a control device that controls the rotating mechanism and the reciprocating mechanism,
wherein the ion beam has a center region where a beam current density is a predetermined value or more in the moving direction, and a peripheral region which is formed on both sides of the center region and where the beam current density is less than the predetermined value, a center region size of the ion beam in a direction orthogonal to the moving direction is larger than a substrate size in the direction orthogonal to the moving direction, and
the control device reciprocates the substrate being held by the substrate holder such that a part of the substrate overlaps a beam irradiation range even at both reciprocating ends and continuously rotates the substrate while the substrate is being reciprocated.

2. The ion beam irradiation device according to claim 1, wherein
the center region size in the moving direction is smaller than the substrate size in the moving direction.

3. The ion beam irradiation device according to claim 1, wherein
when the moving direction is defined as a left-right direction, a substrate end distance between a right end of the substrate when the substrate moves to a leftmost side and a left end of the substrate when the substrate moves to a rightmost side is equal to or less than the center region size in the moving direction.

4. The ion beam irradiation device according to claim 1, wherein
an irradiation shape of the center region is a rectangular shape, and
a longitudinal direction of the rectangular shape orthogonally intersects the moving direction.

5. The ion irradiation device according to claim 1, wherein
the control device controls the reciprocating mechanism based on a control waveform in which a position of the substrate is a continuous function of time.

6. An ion beam irradiation method performed on a substrate in a vacuum atmosphere, the ion beam irradiation method comprising:
using an ion beam irradiation device that includes:
a vacuum container that is exhausted to vacuum;
a substrate holder that holds a substrate in the vacuum container;
a rotating mechanism that causes the substrate holder to rotate about a center portion of the substrate being held by the substrate holder;
a reciprocating mechanism that reciprocates the substrate holder and the rotating mechanism in a moving direction which is predetermined; and
an ion beam irradiator that irradiates the substrate being held by the substrate holder with an ion beam; wherein
the ion beam having a center region where a beam current density is a predetermined value or more in the moving direction, and a peripheral region which is formed on both sides of the center region and where the beam current density is less than the predetermined value, a center region size of the ion beam in a direction orthogonal to the moving direction being larger than a substrate size in the direction orthogonal to the moving direction, and
reciprocating the substrate being held by the substrate holder such that a part of the substrate overlaps a beam irradiation range even at both reciprocating ends, and continuously rotating the substrate while the substrate is being reciprocated, thereby irradiating the substrate with the ion beam.

7. The ion beam irradiation device according to claim 2, wherein
when the moving direction is defined as a left-right direction, a substrate end distance between a right end of the substrate when the substrate moves to a leftmost side and a left end of the substrate when the substrate moves to a rightmost side is equal to or less than the center region size in the moving direction.

8. The ion beam irradiation device according to claim 2, wherein
an irradiation shape of the center region is a rectangular shape, and
a longitudinal direction of the rectangular shape orthogonally intersects the moving direction.

9. The ion beam irradiation device according to claim 3, wherein
an irradiation shape of the center region is a rectangular shape, and
a longitudinal direction of the rectangular shape orthogonally intersects the moving direction.

10. The ion irradiation device according to claim 2, wherein
the control device controls the reciprocating mechanism based on a control waveform in which a position of the substrate is a continuous function of time.

11. The ion irradiation device according to claim 3, wherein
the control device controls the reciprocating mechanism based on a control waveform in which a position of the substrate is a continuous function of time.

12. The ion irradiation device according to claim 4, wherein
the control device controls the reciprocating mechanism based on a control waveform in which a position of the substrate is a continuous function of time.

* * * * *